(12) United States Patent
Wang et al.

(10) Patent No.: US 9,433,099 B2
(45) Date of Patent: Aug. 30, 2016

(54) PACKAGE CARRIER

(71) Applicants: Chin-Sheng Wang, Hsinchu County (TW); Ching-Sheng Chen, Hsinchu County (TW); Chao-Min Wang, Hsinchu (TW)

(72) Inventors: Chin-Sheng Wang, Hsinchu County (TW); Ching-Sheng Chen, Hsinchu County (TW); Chao-Min Wang, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 275 days.

(21) Appl. No.: 14/072,803

(22) Filed: Nov. 6, 2013

(65) Prior Publication Data
US 2015/0092358 A1    Apr. 2, 2015

(30) Foreign Application Priority Data

Oct. 1, 2013 (TW) .............................. 102135527 A

(51) Int. Cl.
*H05K 7/00* (2006.01)
*H05K 3/00* (2006.01)
*H05K 3/34* (2006.01)

(52) U.S. Cl.
CPC ..... *H05K 3/007* (2013.01); *H01L 2224/48091* (2013.01); *H01L 2224/48228* (2013.01); *H01L 2924/15311* (2013.01); *H05K 3/3452* (2013.01); *H05K 2201/0376* (2013.01); *H05K 2203/0156* (2013.01)

(58) Field of Classification Search
CPC .................. H05K 1/132–1/167; H05K 1/111; H05K 1/141; H01L 2924/01078–2924/01079

USPC .................. 361/803, 764–795; 174/258–264
See application file for complete search history.

(56) References Cited

U.S. PATENT DOCUMENTS

| 2003/0121146 | A1 | 7/2003 | Schmidt |
| 2009/0065243 | A1* | 3/2009 | Nakai ............... C23C 18/54 174/257 |
| 2011/0286189 | A1* | 11/2011 | Nakamura ......... H01L 21/4857 361/772 |
| 2013/0062761 | A1 | 3/2013 | Lin et al. |
| 2013/0100625 | A1* | 4/2013 | Fujii ................. H05K 1/0366 361/783 |

FOREIGN PATENT DOCUMENTS

| JP | 2005216989 | 8/2005 |
| JP | 2007013092 | 1/2007 |
| JP | 2008258373 | 10/2008 |
| TW | 200703590 | 1/2007 |
| TW | 201212743 | 3/2012 |

(Continued)

OTHER PUBLICATIONS

Office Action of Japan Counterpart Application, issued on Apr. 14, 2015, p. 1-p. 5, in which the listed references(Ref. 1-6) were cited.

(Continued)

*Primary Examiner* — Tuan T Dinh
(74) *Attorney, Agent, or Firm* — Jianq Chyun IP Office

(57) ABSTRACT

A package carrier including a removable supporting plate and a circuit board is provided. The removable supporting plate includes a dielectric layer, a copper foil layer and a releasing layer. The dielectric layer is disposed between the copper foil layer and the releasing layer. The circuit board is disposed on the removable supporting plate and directly contacts the releasing layer. A thickness of the circuit board is between 30 μm and 100 μm.

9 Claims, 3 Drawing Sheets

(56) References Cited

FOREIGN PATENT DOCUMENTS

| | | |
|---|---|---|
| WO | 2011122532 | 10/2011 |
| WO | 2011152424 | 12/2011 |

OTHER PUBLICATIONS

Office Action of Taiwan Counterpart Application, issued on Jun. 5, 2015, p. 1-p. 6, in which the listed references(Ref. 7-9) were cited.

* cited by examiner

PACKAGE CARRIER

CROSS-REFERENCE TO RELATED APPLICATION

This application claims the priority benefit of Taiwan application serial no. 102135527, filed on Oct. 1, 2013. The entirety of the above-mentioned patent application is hereby incorporated by reference herein and made a part of this specification.

BACKGROUND OF THE INVENTION

1. Field of the Invention

The invention relates to a carrier and more particularly, to a package carrier.

2. Description of Related Art

A chip package provides a chip with proper signal and heat transmission paths and protects the chip structure. A leadframe often serves as a carrier of the chip when a conventional wire bonding technique is applied. As contact density in the chip gradually increases, the leadframe is no longer able to further improve the contact density and thus can be replaced by a package carrier which can achieve favorable contact density. Besides, the chip is packaged onto the package carrier by conductive media, such as metal conductive wires or bumps.

Generally, in order to form the package carrier, a core dielectric layer often serves as a core material, and patterned circuit layers and patterned dielectric layers are alternately stacked on the core dielectric layer by performing a fully additive process, a semi-additive process, a subtractive process, or any other process. Consequently, the core dielectric layer accounts for a great proportion of the whole thickness of the package carrier. If the thickness of the core dielectric layer cannot be effectively reduced, it will be very difficult to reduce the thickness of the chip package.

SUMMARY OF THE INVENTION

The invention is directed to a package carrier adapted to carry at least one chip.

The package carrier of the invention includes a removable supporting plate and a circuit board. The removable supporting plate includes a dielectric layer, a copper foil layer and a releasing layer. The dielectric layer is disposed between the copper foil layer and the releasing layer. The circuit board is disposed on the removable supporting plate and directly contacts the releasing layer, and a thickness of the circuit board is between 30 µm to 100 µm.

In an embodiment of the invention, the circuit board includes a circuit layer, a first solder mask layer and a second solder mask layer. The circuit layer has an upper surface and a lower surface opposite to each other. The first solder mask layer is disposed on the upper surface of the circuit layer and exposes a portion of the upper surface. The second solder mask layer is disposed on the lower surface of the circuit layer and exposes a portion of the lower surface. The releasing layer and the second solder mask layer are conformally disposed, and the lower surface exposed by the second solder mask layer directly contacts the releasing layer.

In an embodiment of the invention, the circuit board includes a first patterned circuit layer, a second patterned circuit layer, an insulation layer, at least one conductive through hole, a first solder mask layer and a second solder mask layer. The insulation layer is disposed between the first patterned circuit layer and the second patterned circuit layer, and has a first surface and a second surface opposite to each other. The conductive through hole passes through the first surface and the second surface of the insulation layer, and is electrically connected to the first patterned circuit layer and the second patterned circuit layer. The first solder mask layer is disposed on the first surface of the insulation layer and covers a portion of the first patterned circuit layer. The second solder mask layer is disposed on the second surface of the insulation layer and covers a portion of the second patterned circuit layer. The releasing layer and the second solder mask layer are conformally disposed, and the second patterned circuit layer exposed by the second solder mask layer directly contacts the releasing layer.

In an embodiment of the invention, a thickness of the dielectric layer of the removable supporting plate is greater than a thickness of the insulation layer.

In an embodiment of the invention, the thickness of the insulation layer is less than or equal to 30 µm.

In an embodiment of the invention, the first patterned circuit layer is embedded in the insulation layer, and a top surface of the first patterned circuit layer is aligned to a first surface.

In an embodiment of the invention, the first patterned circuit layer is disposed on the first surface of the insulation layer.

In an embodiment of the invention, the second patterned circuit layer is embedded in the insulation layer, and a bottom surface of the second patterned circuit layer is aligned to the second surface.

In an embodiment of the invention, the second patterned circuit layer is disposed on the second surface of the insulation layer.

In an embodiment of the invention, a material of the releasing layer includes a metal material or a resin material.

Based on above, in the package carrier of the invention, the removable supporting plate is served as a supporting structure for supporting the circuit board, and the removable supporting plate may be removed after a chip is disposed on the circuit board of the package carrier and the packaging is completed. Therefore, in comparison with a package structure having a core dielectric layer in conventional art, a package structure composed of the package carrier of the invention can have a relatively small thickness.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

FIG. 1' is a schematic cross-sectional view of a package carrier according to another embodiment of the invention.

DESCRIPTION OF THE EMBODIMENTS

Figure 1:
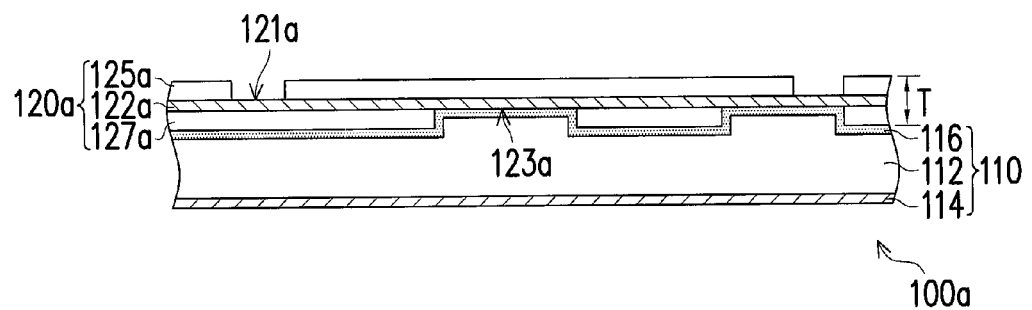
FIG. 1 is a schematic cross-sectional view of a package carrier according to an embodiment of the invention.
Figure 1:
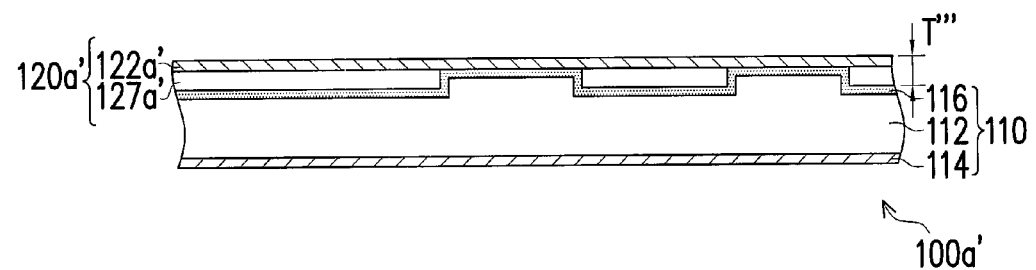

FIG. 1 is a schematic cross-sectional view of a package carrier according to an embodiment of the invention. Referring to FIG. 1, in the present embodiment, a package carrier 100a includes a removable supporting plate 110 and a circuit board 120a. The removable supporting plate 110 includes a dielectric layer 112, a copper foil layer 114 and a releasing layer 116. The dielectric layer 112 is disposed between the copper foil layer 114 and the releasing layer 116. The circuit board 120a is disposed on the removable supporting plate 110 and directly contacts the releasing layer 116. A thickness of the circuit board 120a is between 30 μm to 100 μm.

More specifically, in the present embodiment, the circuit board 120a includes a circuit layer 122a, a first solder mask layer 125a and a second solder mask layer 127a. Namely, the circuit board 120a of the present embodiment is particularly a single-layer circuit board, and the thickness of the circuit board 122a may be less than or equal to 30 μm. The circuit layer 122a has an upper surface 121a and a lower surface 123a opposite to each other. The first solder mask layer 125a is disposed on the upper surface 121a of the circuit layer 122a and exposes a portion of the upper surface 121a. The second solder mask layer 127a is disposed on the lower surface 123a of the circuit layer 122a and exposes a portion of the lower surface 123a. The releasing layer 116 and the second solder mask layer 127a are conformally disposed, and the lower surface 123a exposed by the second solder mask layer 127a directly contacts the releasing layer 116. Herein, a material of the releasing layer 116 includes a metal material or a resin material.

Since the package carrier 100a of the present embodiment includes the removable supporting plate 110 which may serve as a supporting structure for supporting the circuit board 120a having the thickness being relatively thinner (e.g., the single-layer circuit board as depicted in FIG. 1). Subsequently, after a chip (not illustrated) is disposed on the circuit board 120a of the package carrier 100a and a packaging thereof is completed, the removable supporting plate 110 may then be removed. In other words, before packaging the chip, the removable supporting plate 110 may serve as the supporting structure; and after packaging the chip, the removable supporting plate 110 may be removed to reduce a whole thickness of a package structure. Therefore, in comparison with a package structure having a core dielectric layer in conventional art, a package structure composed of the package carrier 100a of the present embodiment can have a relatively small thickness.

It should be noted that, in another embodiment, referring to FIG. 1', a circuit board 120a' in a package carrier 100a' may include a solder mask layer 127' at a single side only, and a circuit board 122a' may be disposed on the solder mask layer 127'. In this case, a whole thickness T'''' of the circuit board 120a' is constituted by a thickness of the circuit layer 122a' of single-layer plus a thickness of the solder mask layer 127' of single-layer.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
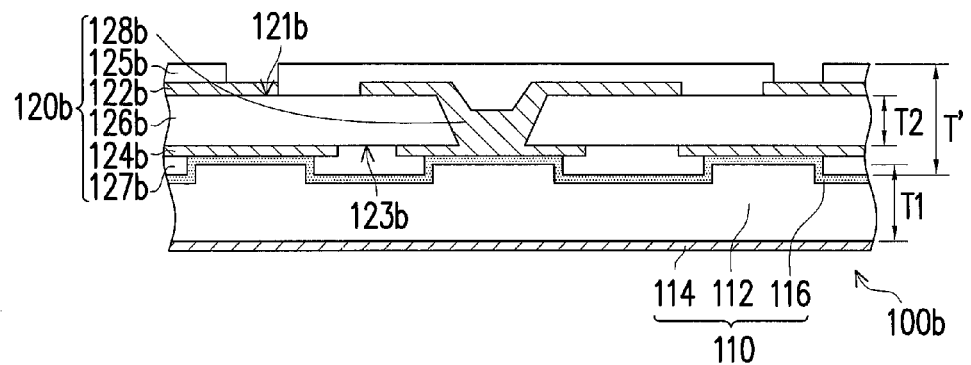
FIG. 2 is a schematic cross-sectional view of a package carrier according to another embodiment of the invention.

FIG. 2 is a schematic cross-sectional view of a package carrier according to another embodiment of the invention. Referring to FIG. 2, a package carrier 100b of the present embodiment is similar to the package carrier 100a of FIG. 1, a difference of the two is that, a circuit board 120b of the present embodiment is particularly a double-layer circuit board. More specifically, in the present embodiment, the circuit board 120b includes a first patterned circuit layer 122b, a second patterned circuit layer 124b, an insulation layer 126b, at least one conductive through hole 128b, a first solder mask layer 125b and a second solder mask layer 127b. The insulation layer 126b is disposed between the first patterned circuit layer 122b and the second patterned circuit layer 124b, and includes a first surface 121b and a second surface 123b opposite to each other. As shown in FIG. 2, in the present embodiment, the first patterned circuit layer 122b is disposed on the first surface 121b of the insulation layer 126b, and the second patterned circuit layer 124b is disposed on the second surface 123b of the insulation layer 126b. Herein, a thickness T1 of the dielectric layer 112 of the removable supporting plate 110 is greater than a thickness T2 of the insulation layer 126b. More preferably, the thickness of the insulation layer 126b of the circuit board 120b is less than or equal to 30 μm.

Furthermore, the conductive through hole 128b of the circuit board 120b passes through the first surface 121b and the second surface 123b of the insulation layer 126b, and is electrically connected to the first patterned circuit layer 122b and the second patterned circuit layer 124b. The first solder mask layer 125b is disposed on the first surface 121b of the insulation layer 126b and covers a portion of the first patterned circuit layer 122b. The second solder mask layer 127b is disposed on the second surface 123b of the insulation layer 126b and covers a portion of the second patterned circuit layer 124b. The releasing layer 116 and the second solder mask layer 127b are conformally disposed, and the second patterned circuit layer 124b exposed by the second solder mask layer 127b directly contacts the releasing layer 116. More preferably, a thickness T' of the circuit board 120b is between 30 μm and 100 μm.

Figure 3:
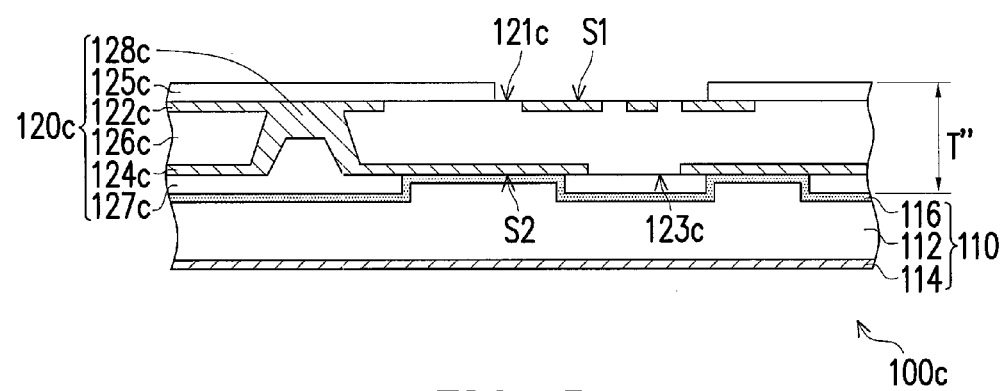
FIG. 3 is a schematic cross-sectional view of a package carrier according to another embodiment of the invention.

FIG. 3 is a schematic cross-sectional view of a package carrier according to another embodiment of the invention. Referring to FIG. 3, a package carrier 100c of the present embodiment is similar to the package carrier 100b of FIG. 2, a difference of the two is that, a circuit board 120c of the present embodiment is particularly a double-layer circuit board and the circuit layer belongs to an embedded circuit. More specifically, in the present embodiment, a first patterned circuit layer 122c of the circuit board 120c is embedded in an insulation layer 126c, and a top surface S1 of the first patterned circuit layer 122c is aligned to a first surface 121c. A second patterned circuit layer 124c of the circuit board 120c is embedded in the insulation layer 126c, and a bottom surface S2 of the second patterned circuit layer 124c is aligned to a second surface 123c. A conductive through hole 128c is electrically connected to the first patterned circuit layer 122c and the second patterned circuit layer 124c. A first solder mask layer 125c and a second solder mask layer 127c are disposed on the first surface 121c and the second surface 123c respectively, and expose a portion of the first patterned circuit layer 122c and a portion of the second patterned circuit layer 124c respectively. More preferably, a thickness T'' of the circuit board 120c is between 30 μm and 100 μm.

It should be noted that, the circuit boards (120a, 120a', 120b and 120c) of the package carriers (100a, 100a', 100b, 100c) in the embodiments are at most two-layer circuit layer, and the whole thicknesses (T, T', T" and T"') of the circuit boards (120a, 120a', 120b and 120c) of the package carriers (100a, 100a', 100b, 100c) are all between 30 μm to 100 μm. In the circuit boards (120a, 120a', 120b and 120c) within said thickness range, a supporting strength thereof is insufficient due to the thicknesses being relatively thinner. Therefore, the removable supporting plate 110 may serve as a supporting structure for reinforcing overall structural strengths of the package carriers (100a, 100a', 100b, 100c). When the thickness range exceeds greater than 100 μm, or the circuit board has more than two-layer circuit layer, which indicates that a strength of the circuit board is sufficient to support the chip being disposed thereon in subsequent process, thus it is not adapted to the invention.

Figure 4:
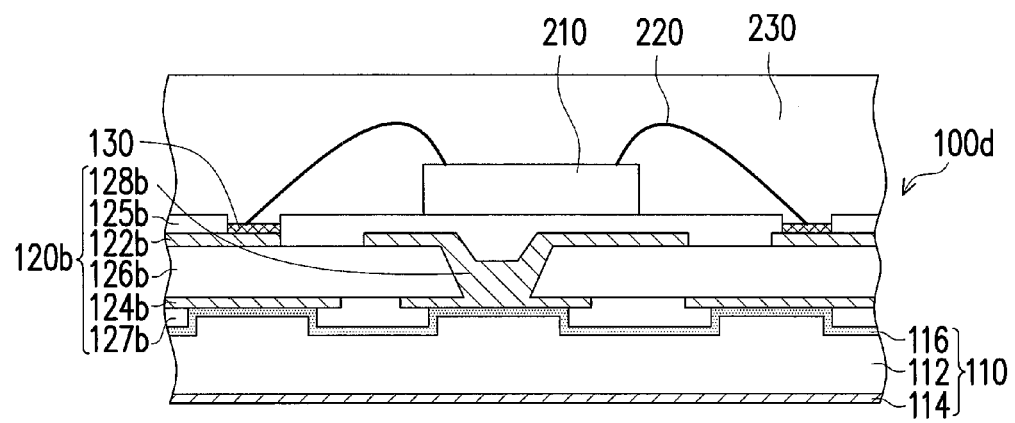
FIG. 4 is a schematic cross-sectional view of the package carrier depicted in FIG. 2 which carries a chip.

FIG. 4 is a schematic cross-sectional view of the package carrier depicted in FIG. 2 which carries a chip. Referring to FIG. 4, when a chip 210 is disposed on a circuit board 100d, the chip 210 may be electrically connected the first patterned circuit layer 122b (which can be deemed as pads) exposed by the first solder mask layer 125b through a plurality of wires 220. In order to make the first patterned circuit layer 122b exposed by the first solder mask layer 125b to provide a more preferable contact reliability, the package carrier 100d of the present embodiment further includes a surface treatment layer 130 as compared to the package carrier 100b depicted in FIG. 2. The surface treatment layer 130 is disposed on the first patterned circuit layer 122b exposed by the first solder mask layer 125b, so as prevent the pads from being oxidized or contaminated by the outside world. Thereafter, the chip 210, the wires 220 and the package carrier 100d may be packaged through an encapsulation adhesive 230.

Figure 5:
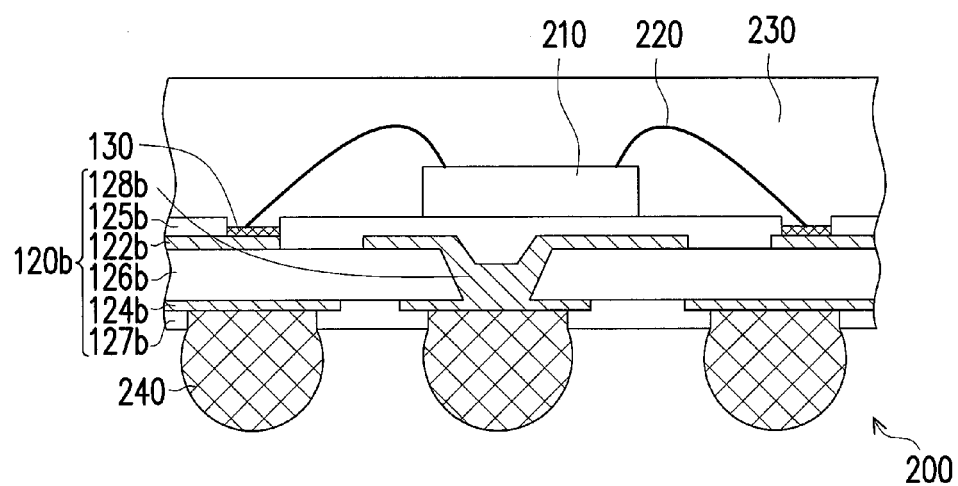
FIG. 5 is a schematic cross-sectional view of a package structure composed of the package carrier depicted in FIG. 2.

Since the package carrier 100d of the present embodiment includes the removable supporting plate 110, thus during processes of disposing the chip 210, forming the wires 220 and performing the packaging, the removable supporting plate 110 may serve as a supporting structure for providing a sufficient supporting strength to reinforce a structural strength of the circuit board 120b. Subsequently, in order to satisfy the development trend of the package structure towards light, thin, short, and small, after packaging, the removable supporting plate 110 of the package carrier 100d may be removed to expose the second patterned circuit layer 124b exposed by the second solder mask layer 127b, as shown in FIG. 5. Thereafter, a plurality of solders 240 may be bonded on the second patterned circuit layer 124b exposed by the second solder mask layer 127b thereby forming a package structure 200 capable of electrically connecting to external circuits. In this case, since the removable supporting plate 110 in the package structure 200 is already removed, a whole thickness of the package structure 200 may be effectively reduced.

In summary, in the package carrier of the invention, the removable supporting plate is served as a supporting structure for supporting the circuit board, and the removable supporting plate may be removed after a chip is disposed on the circuit board of the package carrier and the packaging is completed. Therefore, in comparison with a package structure having a core dielectric layer in conventional art, a package structure composed of the package carrier of the invention can have a relatively small thickness.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A package carrier, comprising:
   a removable supporting plate comprising a dielectric layer, a copper foil layer and a releasing layer, wherein the dielectric layer is disposed between the copper foil layer and the releasing layer; and
   a circuit board disposed on the removable supporting plate and directly contacting the releasing layer the circuit board comprising:
   a circuit layer comprises a first patterned circuit layer and a second patterned circuit layer; and an insulation layer disposed between the first patterned circuit layer and the second patterned circuit layer, and having a first surface and a second surface opposite to each other;
   a first patterned solder mask layer disposed on the upper surface of the first patterned circuit layer and exposing a portion of the upper surface: and
   a second patterned solder mask layer disposed between the second pattern circuit layer and the releasing layer and on the lower surface of the second pattern circuit layer and exposing a portion of the lower surface, wherein the releasing layer and the second patterned solder mask layer are conformally disposed, a side surface of the second patterned solder mask layer is covered by the releasing layer, and the lower surface exposed by the second patterned solder mask layer directly contacts the releasing layer, and wherein a thickness of the circuit board is between 30 μm to 100 μm.

2. The package carrier as recited in claim 1, wherein the circuit board further comprises:
   at least one conductive through hole passing through the first surface and the second surface of the insulation layer, and electrically connected to the first patterned circuit layer and the second patterned circuit layer,
   wherein the first patterned solder mask layer disposed on the first surface of the insulation layer and covering a portion of the first patterned circuit layer, and the second patterned solder mask layer disposed on the second surface of the insulation layer and covering a portion of the second patterned circuit layer, and wherein the second patterned circuit layer exposed by the second patterned solder mask layer directly contacts the releasing layer.

3. The package carrier as recited in claim 2, wherein a thickness of the dielectric layer of the removable supporting plate is greater than a thickness of the insulation layer.

4. The package carrier as recited in claim 1, wherein a material of the releasing layer includes a metal material or a resin material.

5. The package carrier as recited in claim 2, wherein the first patterned circuit layer is embedded in the insulation layer, and a top surface of the first patterned circuit layer is aligned to the first surface.

6. The package carrier as recited in claim 2, wherein the first patterned circuit layer is disposed on the first surface of the insulation layer.

7. The package carrier as recited in claim 2, wherein the second patterned circuit layer is embedded in the insulation layer, and a bottom surface of the second patterned circuit layer is aligned to the second surface.

8. The package carrier as recited in claim 2, wherein the second patterned circuit layer is disposed on the second surface of the insulation layer.

9. The package carrier as recited in claim 3, wherein the thickness of the insulation layer is less than or equal to 30 μm.

* * * * *